US012674725B2

(12) United States Patent
Alshaiban et al.

(10) Patent No.: US 12,674,725 B2
(45) Date of Patent: Jul. 7, 2026

(54) METHOD AND APPARATUS FOR TESTING THE HEALTH OF A PROXIMITY VIBRATION SENSORY LOOP

(71) Applicant: SAUDI ARABIAN OIL COMPANY, Dhahran (SA)

(72) Inventors: Fawaz Mohammed Alshaiban, Buqayq (SA); Abdulrahman Hussain Alswaidan, Dammam (SA); Abdallah Habeeb Alshomari, Al-hasa (SA); Ayidh Jassi Alqahtani, Dhahran (SA); Saeed Saleh Alghamdi, Buqayq (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 346 days.

(21) Appl. No.: 18/426,757

(22) Filed: Jan. 30, 2024

(65) Prior Publication Data

US 2025/0244208 A1 Jul. 31, 2025

(51) Int. Cl.
*G01R 27/02* (2006.01)
*G01H 1/00* (2006.01)
*G01M 99/00* (2011.01)

(52) U.S. Cl.
CPC ............. *G01M 99/005* (2013.01); *G01H 1/00* (2013.01); *G01R 27/02* (2013.01)

(58) Field of Classification Search
CPC ........ G01M 99/005; G01H 1/00; G01R 27/02
See application file for complete search history.

(56) References Cited

U.S. PATENT DOCUMENTS

| | | | | |
|---|---|---|---|---|
| 5,126,664 A | * | 6/1992 | Howard | G01B 7/023 |
| | | | | 324/207.16 |
| 7,768,258 B2 | * | 8/2010 | Dobsky | G01H 1/06 |
| | | | | 324/207.16 |
| 10,324,055 B2 | * | 6/2019 | McCoy | G01D 21/02 |
| 2020/0300817 A1 | * | 9/2020 | Yazaki | H10N 30/802 |
| 2021/0293611 A1 | * | 9/2021 | Oda | G01M 13/045 |

FOREIGN PATENT DOCUMENTS

| | | | | |
|---|---|---|---|---|
| JP | 2009236596 A | * | 10/2009 | |
| KR | 101977780 B1 | * | 5/2019 | ............. G01D 3/022 |
| WO | WO-9004792 A1 | * | 5/1990 | ......... G01R 31/2805 |

* cited by examiner

*Primary Examiner* — Jamel E Williams
(74) *Attorney, Agent, or Firm* — Osha Bergman Watanabe & Burton LLP

(57) ABSTRACT

Methods and systems include a probe configured to measure a vibration of a machine, an extension cable coupled to the probe having a male coaxial connection, and a probe resistance measurement tool having a female coaxial connection configured to connect to the male coaxial connection of the extension cable. The probe resistance measurement tool is configured to measure a circuit resistance value of the probe and the extension cable while connected. The probe resistance measurement tool includes a first connection point and a second connection point. The system further includes a multimeter including a first lead connected to the first connection point and a second lead connected to the second connection point of the probe resistance measurement tool. The multimeter is configured to receive the vibration measured from the probe.

20 Claims, 7 Drawing Sheets

210

METHOD AND APPARATUS FOR TESTING THE HEALTH OF A PROXIMITY VIBRATION SENSORY LOOP

BACKGROUND

Equipment and machinery, and particularly those with rotation components, may produce and/or experience vibrations. Proximity vibration probes may be used at various locations on equipment or machinery to monitor the vibrations and test resistance. The vibration signals from the probes may be used to monitor the health of the equipment, detect component failures, and identify areas where preventative maintenance may be taken. Typically, resistance testing using proximity vibration probes and extension cables is challenging for technicians, especially in outdoor environments. To perform accurate resistance measurements, leads of multi-meters are required to be accurately and carefully positioned to the proximity vibration probe and extension cable.

Accordingly, there exists a need for testing the health and functionality of proximity vibration probes and extension cables. A probe resistance measurement tool is implemented in a system with a probe, extension cable, and multimeter to check the health and functionality of the probe and extension cable as one connected circuit.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In one aspect, embodiments disclosed herein relate to a system comprising: a probe configured to measure a vibration of a machine; an extension cable coupled to the probe comprising a male coaxial connection, wherein the probe coupled to the extension cable comprises a central conductor and an outer conductor; a probe resistance measurement tool comprising a female coaxial connection configured to connect to the male coaxial connection of the extension cable, the probe resistance measurement tool configured to measure a circuit resistance value of the probe and the extension cable while connected, wherein the circuit resistance value comprises a resistance measured between the central conductor and the outer conductor, wherein the probe resistance measurement tool comprises a first connection point and a second connection point; and a multimeter comprising a first lead connected to the first connection point and a second lead connected to the second connection point of the probe resistance measurement tool, the multimeter configured to receive the vibration measured from the probe.

In one aspect, embodiments disclosed herein relate to a method comprising: coupling a probe to an extension cable, the probe and the extension cable coupled comprises a central conductor and an outer conductor; connecting a female coaxial connection on a probe resistance measurement tool to a male coaxial connection on the extension cable; measuring, via the probe, a vibration of a machine; measuring, via the probe resistance measurement tool, a circuit resistance value of the probe and the extension cable while connected, wherein measuring the circuit resistance value comprises measuring a resistance between the central conductor and the outer conductor; connecting a first lead of a multimeter to a first connection point on the probe resistance measurement tool; connecting a second lead of the multimeter to a second connection point on the probe resistance measurement tool; and receiving, via the multimeter, the vibration measured by the probe when the first lead is connected to the first connection point and the second lead is connected to the second connection point.

Other aspects and advantages of the claimed subject matter will be apparent from the following description and the appended claims.

BRIEF DESCRIPTION OF DRAWINGS

Specific embodiments of the disclosed technology will now be described in detail with reference to the accompanying figures. Like elements in the various figures are denoted by like reference numerals for consistency.

DETAILED DESCRIPTION

Figure 1:
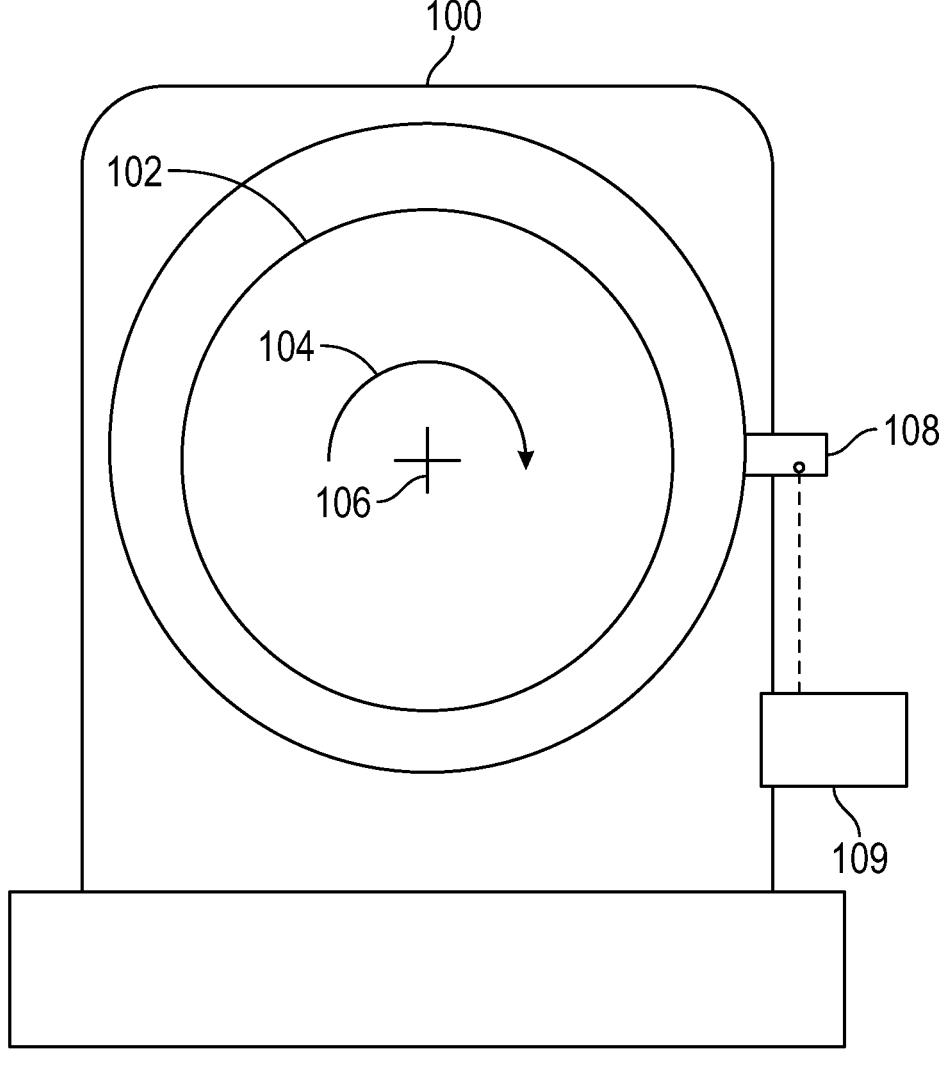
FIG. 1 shows a machine with rotating components in accordance with one or more embodiments.

In the following detailed description of embodiments of the disclosure, numerous specific details are set forth in order to provide a more thorough understanding of the disclosure. However, it will be apparent to one of ordinary skill in the art that the disclosure may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as using the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

In the following description of FIGS. 1-7, any component described regarding a figure, in various embodiments disclosed herein, may be equivalent to one or more like-named components described with regard to any other figure. For brevity, descriptions of these components will not be repeated regarding each figure. Thus, each and every embodiment of the components of each figure is incorporated by reference and assumed to be optionally present within every other figure having one or more like-named components. Additionally, in accordance with various embodiments disclosed herein, any description of the components of a figure is to be interpreted as an optional embodiment which may be implemented in addition to, in conjunction with, or in place of the embodiments described with regard to a corresponding like-named component in any other figure.

It is to be understood that the singular forms "a," "an," and "the" include plural referents unless the context clearly dictates otherwise. Thus, for example, reference to "a force applicator" includes reference to one or more of such force applicators.

Equipment and machinery may produce and/or be subjected to vibrations. For example, machines such as pumps, fans, turbines, and compressors contain rotating components that cause vibrations. Plants or operating facilities using these machines may experience unscheduled upsets, downtime, or loss of performance with machine faults. It is generally beneficial to an operating facility to run machines for longer periods of time and reduce the amount of time that machines are out of use. Additionally, unexpected outages, which may cause a facility to reduce or stop production output, bear a high economic cost.

In general, to mitigate operational upsets and improve facility reliability and performance, machines at an operating facility are monitored and evaluated. Monitoring may be done with sensors or probes designed to measure physical quantities such as temperature or position. The probes may be embedded into the machines or may be external to the machines. By monitoring the machines, the functionality of a machine may be evaluated, the root cause of issues may be determined, and potential failure modes may be predicted. Predictive capability in an operating facility helps operators identify which equipment is most vulnerable to failure and take preventative actions to reduce outages. In addition, strategically employed preventative maintenance increases the longevity and individual output of machines improving the production efficiency of an operational facility. Therefore, it is critical that a proximity vibration sensor consisting of the probe is healthy to provide accurate measurements to accurately monitor and protect valuable rotating assets, such as pumps, compressors, and turbines.

Embodiments disclosed herein relate to a system and method for testing the healthiness and functionality of a proximity vibration sensor loop consisting of the probe and an extension cable. Testing the health and function of a proximity vibration sensor loop is achieved through resistance measurement of the probe alongside the extension cable as one connected circuit. This system and method enables technicians to readily and accurately measure the resistance of the probe alongside the extension cable for checking the health condition of the probe alongside the extension cable. The technicians may include any personnel that operates the proximity vibration sensor loop, such as maintenance instrument technicians.

FIG. 1 depicts a simplified example of a machine (100). The machine (100) of FIG. 1 contains a shaft (102) which rotates (104) about the shaft center (106). The machine (100) may include various types of rotating equipment. The machine (100) produces vibrations. A vibration probe (108) is attached to the machine (100). Many types of vibration probes (108) exist, but generally a vibration probe (108) measures the displacement (x), velocity (x), or acceleration (x) of a component of a machine (100) or the machine (100) itself in time. That is, a vibration probe (108) produces a time-series representing the displacement (x), velocity (x), or acceleration (x) of an object at a sequence of discrete sample times. Additionally, vibration probes (108) may include a speed sensor or tachometer, however, a speed sensor or tachometer is not a strict requirement. As an example, one type of vibration probe (108) is an Eddy-current sensor. Eddy-current sensors are non-contact sensors which generate a magnetic field and measure the relative displacement (x) of an object. Other vibration probes (108) may include, but are not limited to: strain gauges; gyroscopes; accelerometers; and microphones.

FIG. 1 illustrates one vibration probe (108) attached to the simple machine (100). The system may include more than one vibration probe. In the example of FIG. 1, the probe (108) is situated to measure the vibrations (through displacement (x), velocity (x), or acceleration (x)) of the shaft (102). Vibration probes (108) are accompanied by control equipment (109). The control equipment (109) may include additional instruments, multimeters, cables, junction boxes, power supplies, communication and data interfaces, networking capabilities, and control modules.

One with ordinary skill in the art will appreciate that the machine (100) and vibration probes (108) as shown in FIG. 1 may be configured in a variety of ways according to the specific needs of an operating facility or plant. For example, the machine (100) need not include rotating components to produce or be subject to vibrations. As such, the machine (100) and arrangement of vibration probes (108) as shown in FIG. 1 are non-limiting.

The signal of a vibration probe (108), or the signals of many vibration probes (108), may be processed and analyzed, independently or together, to further represent the state, condition, or properties of a machine (100). Analyses and methods to transform vibration probe (108) signals to useful information are herein described as signal processing techniques. Signal processing techniques may include, but are not limited to: the application of a Fourier transform to convert the signal from the time-domain to the frequency-domain; time- or frequency-based signal filtering; autoregressive averages; and high-order statistics. Some signal processing techniques require two or more vibration probe (108) signals.

Figure 2:
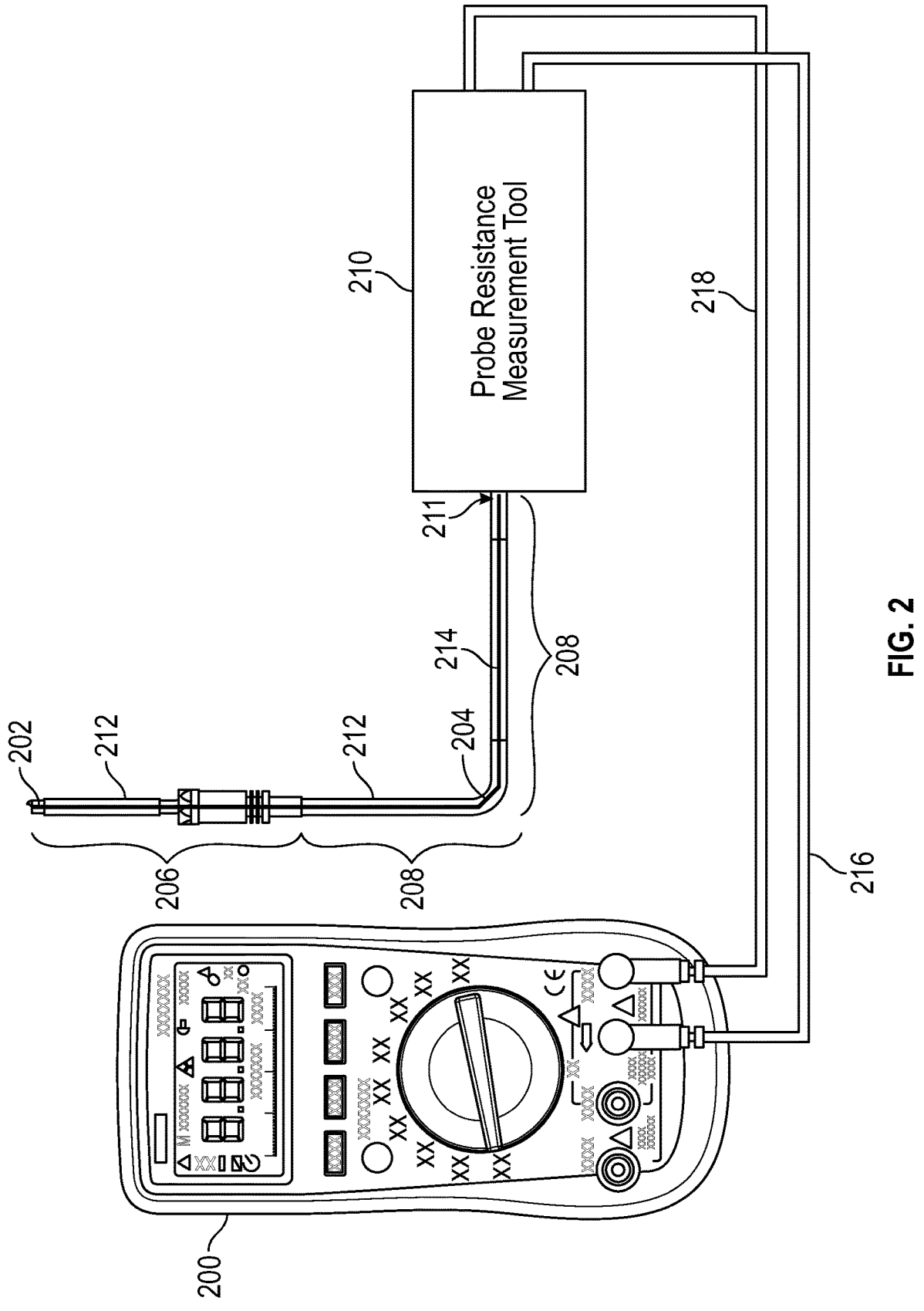
FIG. 2 shows a system in accordance with one or more embodiments.

FIG. 2 shows a system in accordance with one or more embodiments. Specifically, FIG. 2 shows a multimeter (200), a probe (202), an extension cable (204), and a probe resistance measurement tool (210). The probe (202) may be the vibration probe (108) described in FIG. 1. The probe (202) measures vibration of a machine (100) as described in FIG. 1. The probe (202) is coupled to the extension cable (204). The probe (202) coupled to the extension cable (204) define a probe length (206) and a cable length (208), as shown in FIG. 2. The extension cable (204) may be any cable in the industry capable of connecting the probe (202) to other tools, such as the probe resistance measurement tool (210) and/or the multimeter (200). The extension cable (204) includes a male coaxial connection (211) built-in for coupling the extension cable (204) to one or more tools including the probe resistance measurement tool (210). The probe (202) coupled to the extension cable (204) includes an outer conductor (212) and a central conductor (214). The outer conductor (212) and the central conductor (214) may be made up of a copper material for reliable connectivity.

The probe resistance measurement tool (210) measures circuit resistance values for the probe (202) and extension cable (204) while connected as one circuit. Circuit resistance values represent the resistance measured between the central conductor (214) and the outer conductor (212). Conventionally, technicians may use the probe resistance measurement tool (210) in outdoor conditions. The probe resistance measurement tool (210) includes an external body that may be made from Polyphenylene Ether Polystyrene (PPE+PS) for high strength and resistance to harsh weather conditions.

The multimeter (200) may be any conventional multimeter. The multimeter (200) includes two leads, a first lead line (216) and a second lead line (218), for connecting the multimeter (200) to other tools for receiving vibration measurements from the probe (202), as described in FIG. 1. In some embodiments, the first lead line (216) and second lead line (218) are connected to the probe resistance measurement tool (210). Connectors for the leads of the multimeter (200) may be made from a copper material.

Figure 3:
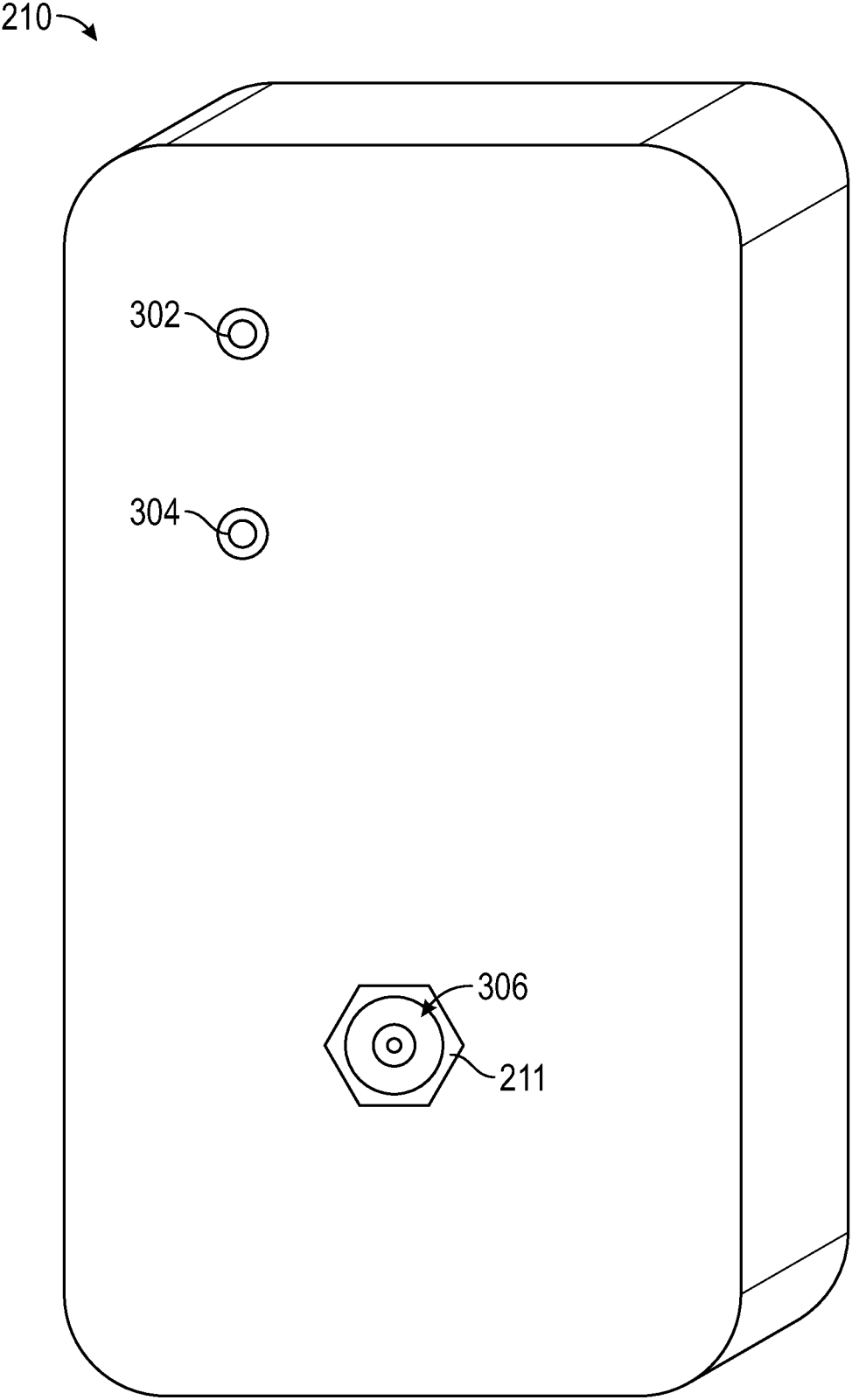
FIG. 3 shows a device in accordance with one or more embodiments.

FIG. 3 shows a device in accordance with one or more embodiments. Specifically, FIG. 3 shows the probe resistance measurement tool (210) used in conjunction with FIG. 2 in accordance with one or more embodiments. The probe resistance measurement tool (210) includes two built-in connection points, a first connection point (302) and a second connection point (304), for connecting lead lines. For example, the first lead line (216) of the multimeter (200) described in FIG. 2 is connected to the first connection point (302) of the probe resistance measurement tool (210). Respectively, the second lead line (218) of the multimeter (200) is connected to the second connection point (304) of the probe resistance measurement tool (210). A person of ordinary skill in the art would appreciate that either lead line (first lead line (216) and the second lead line (218)) may be connected to either connection point (first connection point (302) and second connection point (304)).

The probe resistance measurement tool (210) further includes a female coaxial connection (211) designed for connecting any tool with a male coaxial connection. The female coaxial connection (211) may be a universal female coaxial connector. The female coaxial connection (211) may include an extended sleeve for accommodating male coaxial connections. In some embodiments, the male coaxial connection (211) of the extension cable (204) is connected to the female coaxial connection (211) to couple the probe resistance measurement tool (210) to the extension cable (204) and by extension the probe (202). The female coaxial connection (211) and the male coaxial connection (211) may be miniature in size. The female coaxial connection (211) may include central and outer conductors (306). The central and outer conductors (306) may be made of a copper material.

The female coaxial connection (211) and the male coaxial connection (211) enable a technician to easily connect the probe resistance measurement tool (210) to the multimeter (200) for performing resistance tests to check the health of the probe (202) and extension cable (204).

Figure 4:
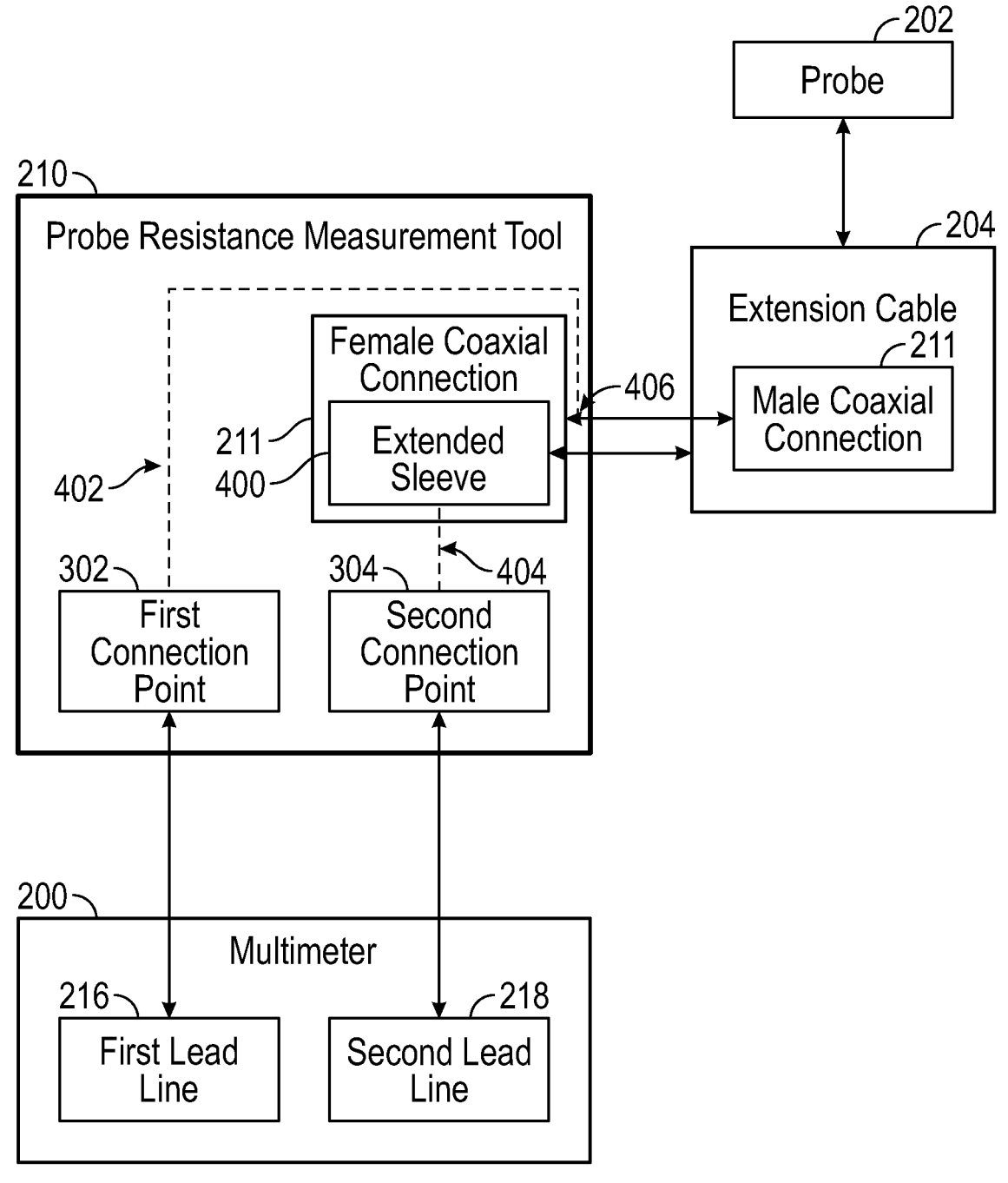
FIG. 4 shows a diagram in accordance with one or more embodiments.

FIG. 4 shows a diagram in accordance with one or more embodiments. Specifically, the diagram depicts the connections of the components described in FIGS. 2 and 3. As depicted, the probe (202) is connected to the extension cable (204). The extension cable (204) includes a male coaxial connection (211) connected to the female coaxial connection (211) of the probe resistance measurement tool (210). In some embodiments, the extension cable (204) is connected to an extended sleeve (400) on the female coaxial connection (211).

The probe resistance measurement tool (210) may include two internal paths, a first internal path (402) and a second internal path (404). The first internal path (402) defines the connection from the first lead line (216) to the first connection point (302) to a connection (406) between the female coaxial connection (211) and the male coaxial connection (211). In some embodiments, a pin in the female coaxial connection (211) makes contact with a pin in the male coaxial connection (211) when connected. The second internal path (404) defines the connection from the second lead line (218) to the second connection point (304) to the extended sleeve (400) on the female coaxial connection (211). The extended sleeve (400) may be in direct contact with the extension cable (204). In some embodiments, the extended sleeve (400) includes a pin for connection of the second lead line (218). The first connection point (302) is connected to the first lead line (216) of the multimeter (200). The second connection point (304) is connected to the second lead of the multimeter (200).

Figure 5:
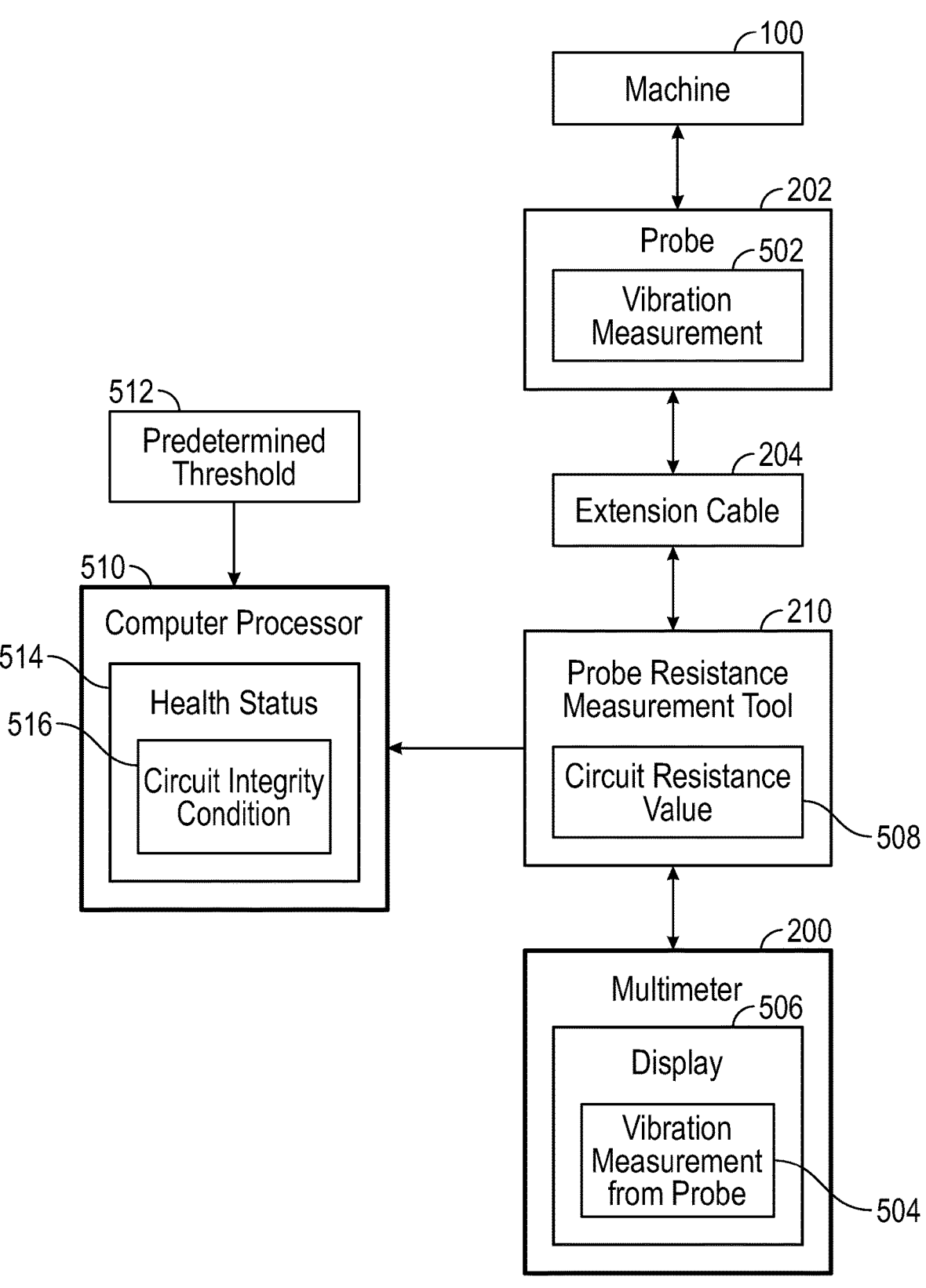
FIG. 5 shows a diagram of a system in accordance with one or more embodiments.

FIG. 5 shows a diagram of a system in accordance with one or more embodiments. As described in other embodiments, the probe (202) is connected to a machine (100) to obtain a vibration measurement (502). The machine (100) may include a pump, a compressor, and/or a turbine. The probe (202) is connected to a probe resistance measurement tool (210) through an extension cable (204). The probe resistance measurement tool (210) is connected to a multimeter (200) to transmit the vibration measurement from the probe (504) (e.g., vibration measurement (502)) to a display (506) on the multimeter (200).

The probe resistance measurement tool (210) measures a circuit resistance value (508) regarding the probe (202) and the extension cable (204). The circuit resistance value (508) may then be transmitted to a computer processor (510) (e.g., computer system (702)) further described in FIG. 7. The computer processor (510) may obtain a predetermined threshold (512). The predetermined threshold (512) includes acceptance value requirements regarding the circuit resistance value (508) based on the probe length (206) and the cable length (208) shown in FIG. 2. The computer processor (510) may determine a health status (514) representing the probe (202) and the extension cable (204) by comparing the circuit resistance value (508) and the predetermined threshold (512) to determine a circuit integrity condition (516).

The probe (202) coupled to the extension cable (204) may create a proximity vibration sensory loop or circuit. In some embodiments, the proximity vibration sensor loop or circuit may be solely the probe (202) itself without any cable (e.g., extension cable (204). The health status may represent the physical condition of the proximity vibration sensory loop for the probe (202). The circuit integrity condition (516) represents whether the proximity vibration sensory loop has good circuit status, short circuit status, or open circuit status. A person of ordinary skill in the art would appreciate that good circuit status may represent that the circuit path of the probe (202) and the extension cable (204) is in good health with good flow of current. Short circuit status may represent lower resistance than normal typically resulting from malfunction of the circuit path. Open circuit status may represent that the circuit path has been interrupted or opened so that current does not flow.

In some embodiments, general ranges of circuit resistance values (508) are assigned as acceptable value requirements for the predetermined threshold (512) to determine the circuit integrity condition (516) and/or health status (514). The health status (514) may include a comparison between the circuit resistance value (508) and the predetermined threshold (512). For example, good circuit status may have an acceptable value requirement range of less than 50 ohms (Ω), short circuit status may have an acceptable value requirement range between 55Ω and 400Ω, and open circuit status may have an acceptable value requirement range of greater than 400Ω. The acceptable value requirements on the predetermined thresholds (512) may depend largely on the probe length (206) and the extension cable length (208). For example, Table 1 outlines different acceptance value requirements for the circuit resistance values (508) between the central conductor (214) and the outer conductor (212) of an 8-millimeter (mm) probe (202) based on various lengths. Table 2 outlines different acceptance values for the circuit resistance values (508) between the center and outer conductors of an 8 mm extension cable (204) for various lengths. Tables 1 and 2 may provide values obtained from a manufacturer manual.

TABLE 1

| Probe Length (m) | Probe Resistance (Ω) |
|---|---|
| 0.5 | 7.45 ± 0.50 |
| 1.0 | 7.59 ± 0.50 |
| 1.5 | 7.73 ± 0.50 |
| 2.0 | 7.88 ± 0.50 |
| 3.0 | 8.17 ± 0.50 |

TABLE 2

| Cable Length (m) | Cable Resistance (Ω) |
|---|---|
| 4 | 0.8 ± 0.13 |
| 4.5 | 0.99 ± 0.15 |
| 7 | 1.54 ± 0.23 |
| 8 | 1.76 ± 0.26 |

The circuit integrity condition (516) and health status (514) may allow a technician to make vital decisions regarding the equipment. Decisions may include replacing the probe, replacing the extension cord, ordering parts for the future, and/or planning maintenance operations. Keeping the probe (202) and extension cable (204) functionally healthy is vital in monitoring and protecting valuable rotating assets and machines.

Figure 6:
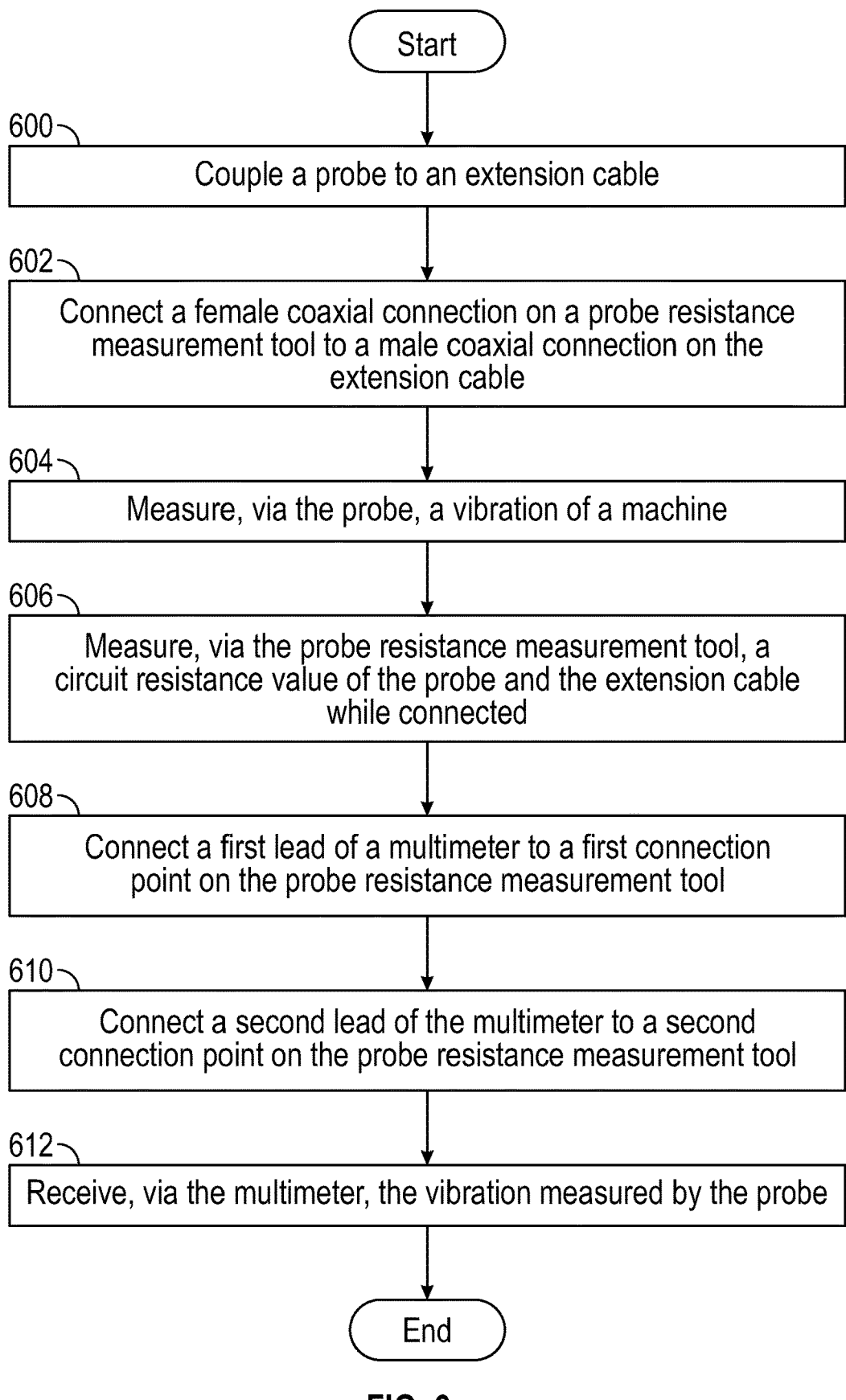
FIG. 6 shows a flowchart in accordance with one or more embodiments.

FIG. 6 shows a flowchart in accordance with one or more embodiments. Specifically, FIG. 6 describes a general method for testing the health status and functionality of a proximity vibration sensory loop consisting of a probe and extension cable in accordance with one or more embodiments. One or more blocks in FIG. 6 may be performed by one or more components (e.g., probe resistance measurement tool (210)) as described in FIGS. 2-5. While the various blocks in FIG. 6 are presented and described sequentially, one of ordinary skill in the art will appreciate that some or all of the blocks may be executed in different orders, may be combined or omitted, and some or all of the blocks may be executed in parallel. Furthermore, the blocks may be performed actively or passively.

In Block 600, the probe is coupled to the extension cable. The probe coupled to the extension cable include a central conductor and an outer conductor. The central conductor and the outer conductor may be made of a copper material. The probe may be a universal proximity vibration sensor. In Block 602, a female coaxial connection on the probe resistance measurement tool is connected to a male coaxial connection on the extension cable. The female coaxial connection may include central and outer conductors made of a copper material. In Block 604, a vibration of a machine is measured via the probe. The vibration of the machine may include vibration of a pump, a compressor, and/or a turbine. In Block 606, a circuit resistance value of the probe and extension cable while connected is measured, via the probe resistance measurement tool. The circuit resistance value includes a resistance measured between the central conductor and the outer conductor of the probe and extension cable. In Block 608, a first lead of a multimeter is connected to a first connection point on the probe resistance measurement tool. In Block 610, a second lead of the multimeter is connected to a second connection point on the probe resistance measurement tool. Via the probe resistance measurement tool, a first internal path may be formed from the first lead connected to the first connection point to a connection between the female coaxial connection and the male coaxial connection. Via the probe resistance measurement tool, a second internal path may be formed from the second lead connected to the second connection point to an extended sleeve on the female coaxial connection. The extended sleeve may be in direct contact with the extension cable.

In Block 612, the vibration measured by the probe is received, via the multimeter. A health status may be determined by a computer processor. The health status represents the probe and extension cable based, at least in part, on the circuit resistance value. The health status may be determined by comparing the circuit resistance value to a predetermined threshold. The predetermined threshold may include acceptance value requirements regarding the circuit resistance value. The acceptance value requirements may be based on a length of the probe and extension cable. The health status may include a circuit integrity condition determined for the probe and extension cable. The circuit integrity condition may include a representation of good circuit status, short circuit status, or open circuit status. In some embodiments, the health status represents a physical condition of the proximity vibration sensory loop for the probe. For example, the probe resistance measurement tool measures the circuit resistance value which is then transmitted to the computer processor. The computer processor compares the circuit resistance value with a predetermined threshold then determines a health status. The health status indicates the circuit integrity condition of the probe and extension cable. The technician may then use the health status to make decisions regarding the probe and extension cable, such as replacing parts or maintenance operations.

Figure 7:
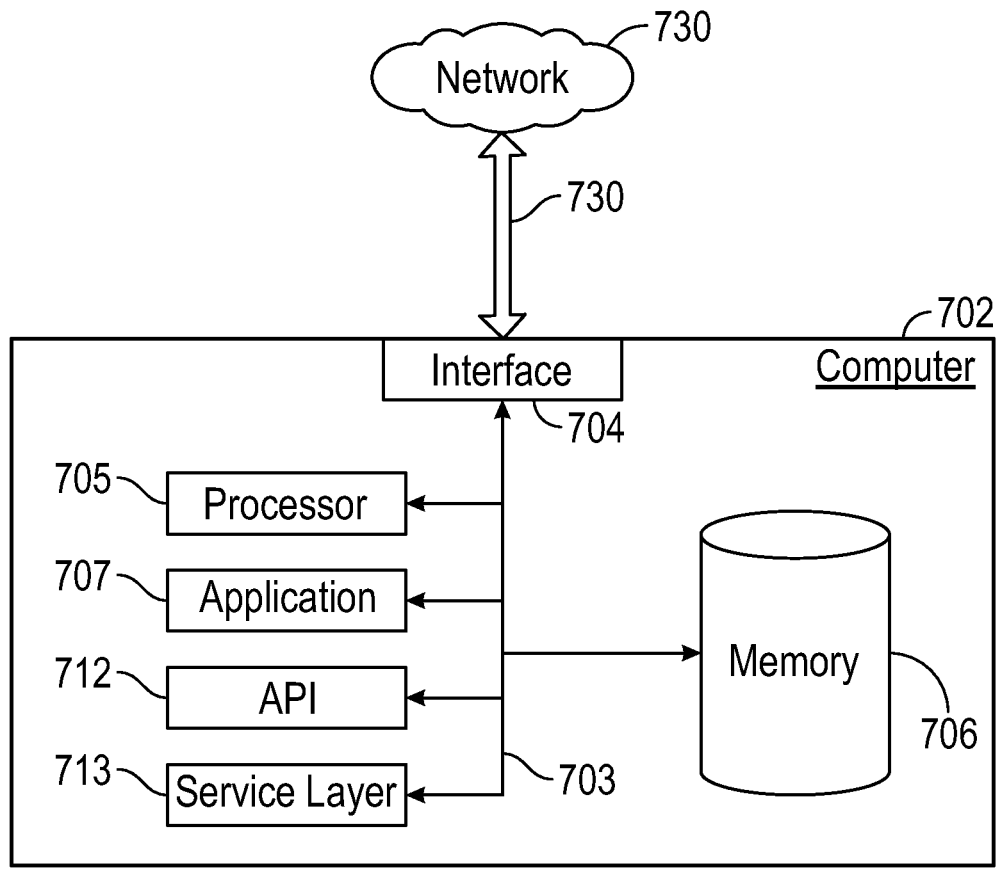
FIG. 7 shows a computer system in accordance with one or more embodiments.

Embodiments may be implemented on a computer system. FIG. 7 is a block diagram of a computer system (702) used to provide computational functionalities associated with described algorithms, methods, functions, processes, flows, and procedures as described in the instant disclosure, according to an implementation. The illustrated computer (702) is intended to encompass any computing device such as a high performance computing (HPC) device, a server, desktop computer, laptop/notebook computer, wireless data port, smart phone, personal data assistant (PDA), tablet computing device, one or more processors within these devices, or any other suitable processing device, including both physical or virtual instances (or both) of the computing device. Additionally, the computer (702) may include a computer that includes an input device, such as a keypad, keyboard, touch screen, or other device that can accept user information, and an output device that conveys information associated with the operation of the computer (702), including digital data, visual, or audio information (or a combination of information), or a GUI.

The computer (702) can serve in a role as a client, network component, a server, a database or other persistency, or any other component (or a combination of roles) of a computer system for performing the subject matter described in the instant disclosure. The illustrated computer (702) is communicably coupled with a network (730). In some implementations, one or more components of the computer (702) may be configured to operate within environments, including cloud-computing-based, local, global, or other environment (or a combination of environments).

At a high level, the computer (702) is an electronic computing device operable to receive, transmit, process, store, or manage data and information associated with the described subject matter. According to some implementations, the computer (702) may also include or be communicably coupled with an application server, e-mail server, web server, caching server, streaming data server, business intelligence (BI) server, or other server (or a combination of servers).

The computer (702) can receive requests over network (730) from a client application (for example, executing on another computer (702)) and responding to the received requests by processing the said requests in an appropriate software application. In addition, requests may also be sent to the computer (702) from internal users (for example, from a command console or by other appropriate access method), external or third-parties, other automated applications, as well as any other appropriate entities, individuals, systems, or computers.

Each of the components of the computer (702) can communicate using a system bus (703). In some implementations, any or all of the components of the computer (702), both hardware or software (or a combination of hardware and software), may interface with each other or the interface (704) (or a combination of both) over the system bus (703) using an application programming interface (API) (712) or a service layer (713) (or a combination of the API (712) and service layer (713). The API (712) may include specifications for routines, data structures, and object classes. The API (712) may be either computer-language independent or dependent and refer to a complete interface, a single function, or even a set of APIs. The service layer (713) provides software services to the computer (702) or other components (whether or not illustrated) that are communicably coupled to the computer (702). The functionality of the computer (702) may be accessible for all service consumers using this service layer. Software services, such as those provided by the service layer (713), provide reusable, defined business functionalities through a defined interface. For example, the interface may be software written in JAVA, C++, or other suitable language providing data in extensible markup language (XML) format or other suitable format. While illustrated as an integrated component of the computer (702), alternative implementations may illustrate the API (712) or the service layer (713) as stand-alone components in relation to other components of the computer (702) or other components (whether or not illustrated) that are communicably coupled to the computer (702). Moreover, any or all parts of the API (712) or the service layer (713) may be implemented as child or sub-modules of another software module, enterprise application, or hardware module without departing from the scope of this disclosure.

The computer (702) includes an interface (704). Although illustrated as a single interface (704) in FIG. 7, two or more interfaces (704) may be used according to particular needs, desires, or particular implementations of the computer (702). The interface (704) is used by the computer (702) for communicating with other systems in a distributed environment that are connected to the network (730). Generally, the interface (includes logic encoded in software or hardware (or a combination of software and hardware) and operable to communicate with the network (730). More specifically, the interface (704) may include software supporting one or more communication protocols associated with communications such that the network (730) or interface's hardware is operable to communicate physical signals within and outside of the illustrated computer (702).

The computer (702) includes at least one computer processor (705). Although illustrated as a single computer processor (705) in FIG. 7, two or more processors may be used according to particular needs, desires, or particular implementations of the computer (702). Generally, the computer processor (705) executes instructions and manipulates data to perform the operations of the computer (702) and any algorithms, methods, functions, processes, flows, and procedures as described in the instant disclosure.

The computer (702) also includes a memory (706) that holds data for the computer (702) or other components (or a combination of both) that can be connected to the network (730). For example, memory (706) can be a database storing data consistent with this disclosure. Although illustrated as a single memory (706) in FIG. 7, two or more memories may be used according to particular needs, desires, or particular implementations of the computer (702) and the described functionality. While memory (706) is illustrated as an integral component of the computer (702), in alternative implementations, memory (706) can be external to the computer (702).

The application (707) is an algorithmic software engine providing functionality according to particular needs, desires, or particular implementations of the computer (702), particularly with respect to functionality described in this disclosure. For example, application (707) can serve as one or more components, modules, applications, etc. Further, although illustrated as a single application (707), the application (707) may be implemented as multiple applications (707) on the computer (702). In addition, although illustrated as integral to the computer (702), in alternative implementations, the application (707) can be external to the computer (702).

There may be any number of computers (702) associated with, or external to, a computer system containing computer (702), each computer (702) communicating over network (730). Further, the term "client," "user," and other appropriate terminology may be used interchangeably as appropriate without departing from the scope of this disclosure. Moreover, this disclosure contemplates that many users may use one computer (702), or that one user may use multiple computers (702).

In some embodiments, the computer (702) is implemented as part of a cloud computing system. For example, a cloud computing system may include one or more remote servers along with various other cloud components, such as cloud storage units and edge servers. In particular, a cloud computing system may perform one or more computing operations without direct active management by a user device or local computer system. As such, a cloud computing system may have different functions distributed over multiple locations from a central server, which may be performed using one or more Internet connections. More specifically, cloud computing system may operate according to one or more service models, such as infrastructure as a service (IaaS), platform as a service (PaaS), software as a service (SaaS), mobile "backend" as a service (MBaaS), serverless computing, artificial intelligence (AI) as a service (AIaaS), and/or function as a service (FaaS).

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

11

What is claimed is:

1. A system comprising:
a probe configured to measure a vibration of a machine;
an extension cable coupled to the probe comprising a male coaxial connection,
wherein the probe coupled to the extension cable comprises a central conductor and an outer conductor;
a probe resistance measurement tool comprising a female coaxial connection configured to connect to the male coaxial connection of the extension cable, the probe resistance measurement tool configured to measure a circuit resistance value of the probe and the extension cable while connected,
wherein the circuit resistance value comprises a resistance measured between the central conductor and the outer conductor,
wherein the probe resistance measurement tool comprises a first connection point and a second connection point; and
a multimeter comprising a first lead connected to the first connection point and a second lead connected to the second connection point of the probe resistance measurement tool, the multimeter configured to receive the vibration measured from the probe.

2. The system of claim 1, wherein the probe resistance measurement tool further comprises:
a first internal path from the first lead connected to the first connection point to a connection between the female coaxial connection and the male coaxial connection; and
a second internal path from the second lead connected to the second connection point to an extended sleeve on the female coaxial connection, wherein the extended sleeve is in direct contact with the extension cable.

3. The system of claim 1, further comprising:
a computer processor configured to determine a health status representing the probe and the extension cable based, at least in part, on the circuit resistance value,
wherein the health status comprises a comparison between the circuit resistance value and a predetermined threshold.

4. The system of claim 3,
wherein the predetermined threshold comprises a plurality of acceptance value requirements regarding the circuit resistance value,
wherein the plurality of acceptance value requirements is based, at least in part, on a length of the probe and the extension cable.

5. The system of claim 3,
wherein the health status comprises a circuit integrity condition of the probe and the extension cable.

6. The system of claim 5,
wherein the circuit integrity condition represents a good circuit status, a short circuit status, or an open circuit status.

7. The system of claim 3,
wherein the health status represents a physical condition of a proximity vibration sensory loop for the probe.

8. The system of claim 1,
wherein the machine comprises a pump, a compressor, or a turbine.

9. The system of claim 1,
wherein the probe is a universal proximity vibration sensor.

10. The system of claim 1,
wherein the female coaxial connection comprises a plurality of central and outer conductors,

wherein the plurality of central and outer conductors, the first connection point, and the second connection point are made of a copper material.

11. A method, the method comprising:
coupling a probe to an extension cable, the probe and the extension cable coupled comprises a central conductor and an outer conductor;
connecting a female coaxial connection on a probe resistance measurement tool to a male coaxial connection on the extension cable;
measuring, via the probe, a vibration of a machine;
measuring, via the probe resistance measurement tool, a circuit resistance value of the probe and the extension cable while connected,
wherein measuring the circuit resistance value comprises measuring a resistance between the central conductor and the outer conductor;
connecting a first lead of a multimeter to a first connection point on the probe resistance measurement tool;
connecting a second lead of the multimeter to a second connection point on the probe resistance measurement tool; and
receiving, via the multimeter, the vibration measured by the probe when the first lead is connected to the first connection point and the second lead is connected to the second connection point.

12. The method of claim 11, further comprising:
forming, via the probe resistance measurement tool, a first internal path from the first lead connected to the first connection point to a connection between the female coaxial connection and the male coaxial connection; and
forming, via the probe resistance measurement tool, a second internal path from the second lead connected to the second connection point to an extended sleeve on the female coaxial connection, wherein the extended sleeve is in direct contact with the extension cable.

13. The method of claim 12, further comprising:
determining, via a computer processor, a health status representing the probe and the extension cable based, at least in part, on the circuit resistance value,
wherein determining the health status comprises comparing the circuit resistance value to a predetermined threshold.

14. The method of claim 13,
wherein the predetermined threshold comprises a plurality of acceptance value requirements regarding the circuit resistance value,
wherein the plurality of acceptance value requirements is based, at least in part, on a length of the probe and the extension cable.

15. The method of claim 13,
wherein determining the health status comprises determining a circuit integrity condition of the probe and the extension cable.

16. The method of claim 15,
wherein determining the circuit integrity condition comprises representing a good circuit status, a short circuit status, or an open circuit status.

17. The method of claim 13,
wherein determining the health status comprises representing a physical condition of a proximity vibration sensory loop for the probe.

18. The method of claim 11,
wherein measuring the vibration of the machine comprises measuring the vibration of a pump, a compressor, or a turbine.

19. The method of claim 11,
wherein coupling the probe comprises coupling a universal proximity vibration sensor.

20. The method of claim 11,
wherein the female coaxial connection comprises a plurality of central and outer conductors,
wherein the plurality of central and outer conductors, the first connection point, and the second connection point are made of a copper material.

\* \* \* \* \*